United States Patent [19]
Kaneko et al.

[11] Patent Number: 5,840,659
[45] Date of Patent: Nov. 24, 1998

[54] METHOD OF PREPARING OXIDE SUPERCONDUCTIVE MATERIAL

[75] Inventors: Tetsuyuki Kaneko; Kazuyuki Hamada; Hisao Yamauchi; Seiji Adachi; Shoji Tanaka, all of Tokyo, Japan

[73] Assignees: Sumitomo Electric Industries, Ltd.; Ube Industries Ltd.; Matsushita Electrical Industrial Co., Ltd.; International Superconductivity Technology Center, all of, Japan

[21] Appl. No.: 818,368

[22] Filed: Mar. 14, 1997

Related U.S. Application Data

[60] Continuation of Ser. No. 487,126, Jun. 7, 1995, abandoned, which is a division of Ser. No. 186,831, Jan. 25, 1994, abandoned, which is a continuation of Ser. No. 891,356, May 29, 1992.

[30] Foreign Application Priority Data

May 30, 1991 [JP] Japan ................................. 3-127939

[51] Int. Cl.$^6$ ................ A23G 1/00; A23G 3/30; A23L 1/10; A23L 1/522
[52] U.S. Cl. .................. 505/501; 505/482; 505/742; 505/783
[58] Field of Search .............. 264/65, 666, 661, 264/677, 681; 505/742, 783, 501, 482

[56] References Cited

U.S. PATENT DOCUMENTS

| | | | |
|---|---|---|---|
| 4,988,668 | 1/1991 | Engler et al. | 505/1 |
| 5,026,680 | 6/1991 | Sugihara et al. | 505/742 |
| 5,155,092 | 10/1992 | Mizuno et al. | 264/65 |
| 5,232,904 | 8/1993 | Wenger et al. | 505/1 |
| 5,236,889 | 8/1993 | Sugihara et al. | 505/1 |
| 5,376,623 | 12/1994 | Tsai et al. | 505/742 |
| 5,378,682 | 1/1995 | Schwarz et al. | 264/65 |
| 5,401,712 | 3/1995 | Singh et al. | 505/500 |
| 5,521,148 | 5/1996 | Torii et al. | 505/120 |
| 5,545,610 | 8/1996 | Higashiyama et al. | 505/120 |
| 5,556,830 | 9/1996 | Sun et al. | 505/125 |
| 5,585,332 | 12/1996 | Tanaka et al. | 505/473 |
| 5,688,383 | 11/1997 | Pang | 204/192.24 |

FOREIGN PATENT DOCUMENTS 516148  12/1992  European Pat. Off. .

OTHER PUBLICATIONS

Kaneko, Tetsuyuki, et al., "Nearly Single–phase Tl–Based '2223' Superconductor with Tc=125 K", Physica C, 185–189(Part I), 691–692, Dec. 1991.

Liu, R.S., et al., "An efficient and reproducible approach for attaining Superconductivity at 128 K in Tl2Ba2Ca2Cu3Oi0–delta", Physica C, 182(1–3), 119–122, Oct. 1991.

Kaneko, Tetsuyuki, et al., "Zero–resistance temperature of Tl–based '2223' superconductor increased to 127 K", 178(4–6), 377–382, Aug. 1991.

Liu, R.S., et al., "Magnetisation and intragrain critical current density of monophasic Tl1.8Ba2Ca2.2Cu3O10–delta", Solid State Communications, 79(1), 43–46, Jul. 1991.

Gruber, H., et al., "Electrical Conductivity, Magnetic Susceptibility, and Infrared Spectra in the Superconducting Systems Bi–Sr–Ca–Cu–O and Tl–Ba–Ca–Cu–O", Physica Status Solidi (b), 153(1), 307–313, May 1989.

Torardi, C.C., et al., "Crystal Structure of Tl2Ba2Ca2Cu3O10, a 125 K Superconductor", Science, 240, 631–634, Apr. 1988.

Grant & Hackh's Chemical Dictionary, 5th ed., McGraw–Hill Book Company, pp. 56, 152, 251, 415, Month not known, 1987.

*Primary Examiner*—Douglas J. McGinty
*Attorney, Agent, or Firm*—Pennie & Edmonds LLP

[57] ABSTRACT

In order to provide a Tl—Ba—Ca—Cu—O superconductive material which can obtain a stable superconducting state and a method of preparing the same, the oxide superconductive material is expressed in the following composition formula:

$$Tl_xBa_2Ca_yCu_3O_z$$

where x, y and z are in relations satisfying $1.5 \leq x \leq 2.0$, $2.0 \leq y \leq 2.5$, $x+y=4.0$ and $9.0 \leq z \leq 11.0$, and comprises tetragonal system superconducting phases having lattice constants of a=0.385 to 0.386 nm and c longer than 3.575 nm, to exhibit zero resistance under a temperature of at least 125 K, while the method comprises a step of mixing powder raw materials in blending ratios for satisfying the above composition formula, a step of sintering the as-formed mixed powder in an oxygen jet or in the atmosphere to obtain a sintered body, and a step of annealing the sintered body in a closed atmosphere at 700° to 800° C. for at least 10 hours.

4 Claims, 6 Drawing Sheets

METHOD OF PREPARING OXIDE SUPERCONDUCTIVE MATERIAL

This is a continuation of application Ser. No. 08/487,126, filed Jun. 7, 1995, now abandoned, which is a divisional application of application Ser. No. 08/186,831, filed Jan. 25, 1994, now abandoned, which is in turn a continuation of application Ser. No. 07/891,356, filed May 29, 1992, now abandoned.

BACKGROUND OF THE INVENTION

1. Field of the Invention

The present invention relates to an oxide superconductive material and a method of preparing the same, and more particularly, it relates to a Tl—Ba—Ca—Cu—O superconductive material and a method of preparing the same.

2. Description of the Background Art

In 1988, Bi—Sr—Ca—Cu—O and Tl—Ba—Ca—Cu—O superconductors were discovered with critical temperatures (Tc) exceeding 100 K. Thereafter many researchers have been made to develop superconductive materials having critical temperatures of at least 120 K, such as $Tl_2Ba_2Ca_2Cu_3O_{10}$ (Tc=125 K) and $TlBa_2Ca_3Cu_4O_{11}$ (Tc=122 K).

However, although $Tl_2Ba_2Ca_2Cu_3O_{10}$ (2223 phase) and $TlBa_2Ca_3Cu_4O_{11}$ (1234 phase) having critical temperatures of at least 120 K completely lose electrical resistance at 125 K and 122 K respectively, methods of preparing such materials are so delicate that it has been difficult to prepare a material which exhibits superconductivity under a temperature exceeding 125 K with excellent reproducibility.

SUMMARY OF THE INVENTION

An object of the present invention is to provide a 2223-phase oxide superconductive material which exhibits superconductivity under a temperature exceeding 125 K, and a method of preparing the same.

The inventive oxide superconductive material is expressed in the following composition formula:

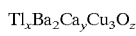

$Tl_xBa_2Ca_yCu_3O_z$ where x, y and z are in relations satisfying $1.5 \leq x \leq 2.0$, $2.0 \leq y \leq 2.5$, $x+y=4.0$ and $9.0 \leq z \leq 11.0$, and comprises tetragonal system superconducting phases having lattice constants of a=0.385 to 0.386 nm and c longer than 3.575 nm, that is, $0.385 < a < 0.386$, and $c > 3.575$.

The oxide superconductive material according to the present invention preferably exhibits superconductivity under a temperature of at least 125 K.

The inventive method is employable for preparation of the aforementioned oxide superconductive material. In more concrete terms, the inventive method is adapted to prepare an oxide superconductive material which is expressed in the following composition formula:

$Tl_xBa_2Ca_yCu_3O_z$ where x, y and z are in relations satisfying $1.5 \leq x \leq 2.0$, $2.0 \leq y \leq 2.5$, $x+y=4.0$ and $9.0$ and $\leq z \leq 11.0$, and comprises a step of mixing powder raw materials in blending ratios for satisfying the composition formula, a step of sintering the as-formed mixed powder in flowing oxygen gas or in air to obtain a sintered body, and a step of annealing the sintered body in a closed atmosphere at 700° to 800° C. for at least 10 hours.

According to the present invention, the sintered body is annealed in a closed atmosphere for at least 10 hours, preferably 10 to 500 hours.

The oxide superconductive material according to the present invention has lattice constants of a=0.385 to 0.386 nm and c longer than 3.575 nm. Thus, it is possible to optimize distances between copper atoms and oxygen atoms as well as the number of carriers to attain a high critical temperature. The oxide superconductive material completely loses electrical resistance under a temperature of at least 125 K when the c-axis length is at least 3.575 nm, and preferably c=3.575 to 3.580 nm. If the c-axis length is less than 3.575 nm, distances between copper atoms and oxygen atoms in the crystal structure are so extremely reduced that excess carriers are introduced into the structure. When the c-axis length exceeds 3.580 nm, on the other hand, the distances between the copper atoms and the oxygen atoms are so excessively increased that carriers cannot be sufficiently introduced into the structure.

According to the present invention, the sintered body is annealed at 700° to 800° C. Due to this annealing, the atoms may conceivably be diffused in the sample. In the present invention, the annealing temperature must be at least 700° C. since the atoms are so insufficiently diffused that the critical temperature is not much increased if the annealing temperature is less than 700° C. If the annealing temperature exceeds 800° C., on the other hand, Tl atoms contained in the sample are extremely evaporated to decompose the 2223 phases, which contribute to superconductivity. Also when the annealing time is too long, the Tl atoms are evaporated to decompose the 2223 phases.

The oxide superconductive material according to the present invention exhibits superconductivity under a temperature of at least 125 K, to implement a stable superconducting state.

According to the method of the present invention, it is possible to prepare an oxide superconductive material which exhibits superconductivity under a temperature of at least 125 K, with excellent reproducibility.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE 1

(1) Starting raw materials were prepared by commercially available $Tl_2O_3$, $BaO_2$, CaO, and CuO powder materials.

These powder raw materials were mixed with each other in blending ratios for attaining a blending composition of $Tl_{1.7}Ba_2Ca_{2.3}Cu_3O_{9.5}$.

The as-formed mixed powder was press-molded into a rectangular parallelopiped of 2 mm by 2 mm by 20 mm, which in turn was wrapped up in gold foil, sintered in flowing oxygen gas at 850° to 900° C. for 5 hours, and cooled in a furnace.

(2) The as-obtained sintered body was again wrapped up in gold foil and introduced into a silica tube, which in turn was decompressed with a vacuum pump until its internal pressure was $10^{-4}$ Torr and sealed. This silica tube was introduced into a furnace and annealed at 750° C. for 80 hours.

Figure 1:
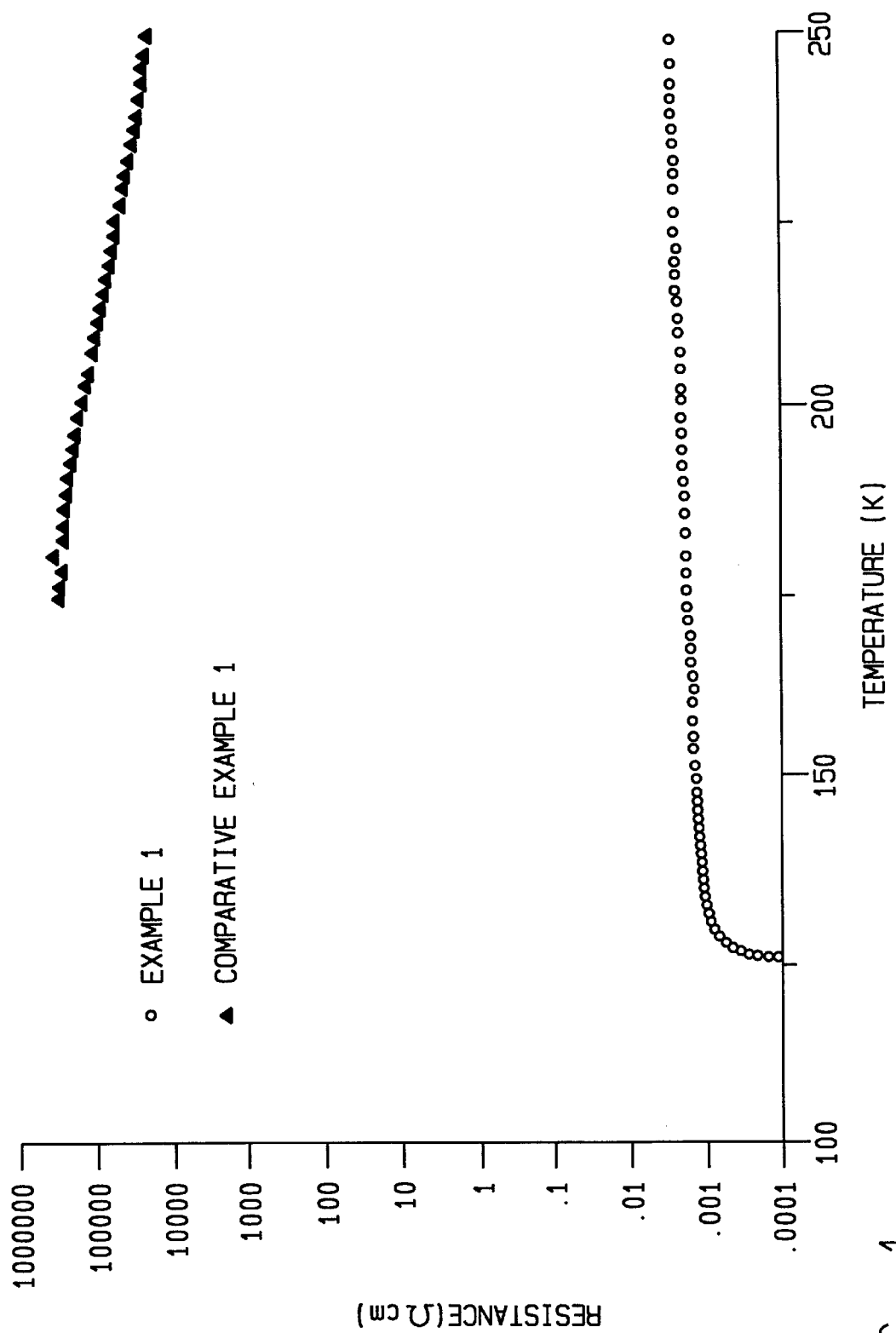
FIG. 1 illustrates resistance/temperature characteristics in relation to Example 1 according to the present invention.

The as-formed sample of Example 1 was taken out from the furnace, and temperature dependency of resistance was measured by a four-probe method. On the other hand, comparative example 1 was prepared by carrying out a step similar to the aforementioned step (1) and then directly annealing the as-obtained sintered body in air at 750° C. for 80 hours, without introducing the same in a silica tube. Then temperature dependency of resistance was measured by a four-probe method similarly to Example 1. FIG. 1 shows the result.

As clearly understood from FIG. 1, Example 1 exhibited a critical temperature (zero-resistance temperature) of 125 K, while the comparative example 1 attained absolutely no superconductivity, with no metallic temperature change of resistance.

Figure 2:
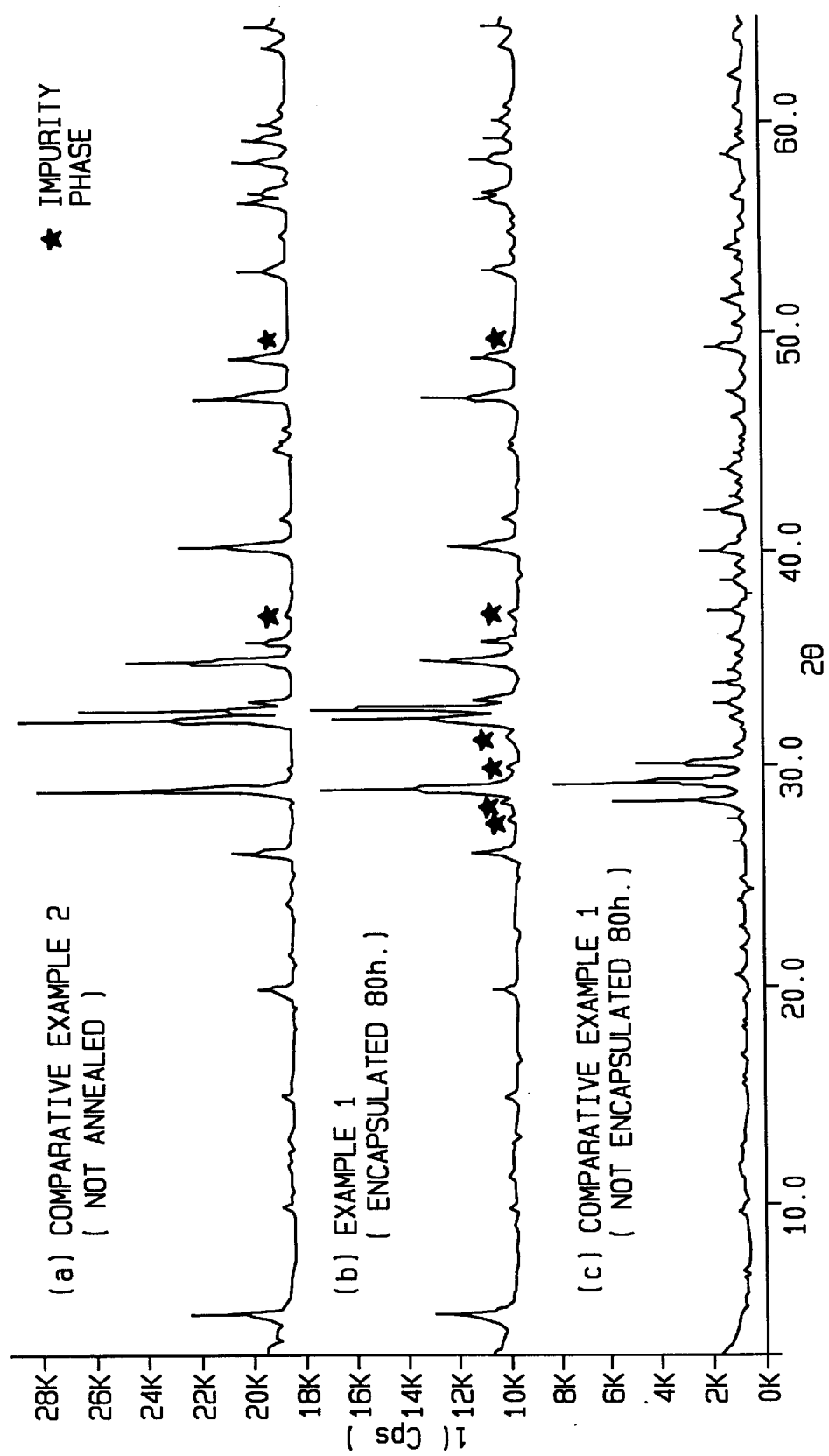
FIG. 2 illustrates powder X-ray diffraction patterns in relation to Example 1 according to the present invention.

Another comparative example 2 was prepared through a step similar to the aforementioned step (1), followed by no annealing step (2). Example 1 and the comparative examples 1 and 2 were subjected to powder X-ray diffraction analysis. FIG. 2 shows the diffraction patterns.

As to the pattern of the comparative example 2 shown in FIG. 2, most peaks are in superconductor structures called 2223 phases, having lattice constants a=0.38 nm and c=3.57 nm. Thus, it is understood that the 2223 phases contributing to superconductivity were already synthesized in the step (1).

As to the pattern of Example 1 shown in FIG. 2, most of the peaks are also in 2223 phases, with a relatively large number of peaks which may be impurity phases as compared with the comparative example 2. This is conceivably because vaporizable TQ atoms were evaporated from the sample during the step (2), to break the 2223 phases.

On the other hand, the pattern of the comparative Example 1 shown in FIG. 2 hardly has peaks which may conceivably be in 2223 phases, since most of the 2223 phases contributing to superconductivity were decomposed by annealing. Thus, it may conceivably be possible to greatly suppress evaporation of Tl atoms during the annealing step by enclosing the sample with a silica tube.

EXAMPLE 2

In order to investigate optimum conditions for the annealing step (2) in the aforementioned Example 1, samples of oxide superconductive materials were prepared in a similar manner to Example 1, except for that sintered bodies were heat treated under conditions of annealing temperatures and times shown in Table 1.

Table 1 shows zero resistance temperatures of the respective samples and diamagnetic signal starting temperatures obtained by measuring dc susceptibility values.

TABLE 1

| Sample | Annealing Condition Temperature (°C.) | Time (hr) | Zero Resistance Temperature (K.) | Diamagnetic Signal Starting Temperature (K.) | Lattice Constant a (nm) | c (nm) |
|---|---|---|---|---|---|---|
| 1 | — | — | 118 | 120 | 0.3855 | 3.571 |
| 2 | 600 | 80 | 118 | 120 | | |
| 3 | 650 | 80 | 119 | 121 | | |
| 4 | 700 | 80 | 123 | 125 | | |
| 5 | 750 | 80 | 125 | 126 | 0.3856 | 3.575 |
| 6 | 800 | 80 | 124 | 125 | | |
| 7 | 850 | 80 | 120 | 122 | | |
| 8 | 900 | 80 | 110 | 115 | | |
| 9 | 750 | 2 | 120 | 122 | | |
| 10 | 750 | 10 | 123 | 126 | | |
| 11 | 750 | 150 | 126 | 128 | 0.3854 | 3.576 |
| 12 | 750 | 250 | 127 | 130 | 0.3855 | 3.577 |
| 13 | 750 | 500 | 126 | 129 | | |
| 14 | 750 | 700 | 125 | 127 | | |

As clearly understood from Table 1, the samples prepared under the annealing conditions of 700° to 800° C. and 10 to 500 hours exhibited high zero resistance temperatures and diamagnetic signal starting temperatures. Particularly the sample No. 12, which was annealed at 750° C. for 250 hours, exhibited the highest zero resistance temperature of 127 K.

The samples having c-axis lengths of at least 3.575 nm exhibited zero resistance temperatures of at least 125 K. On the other hand, the a-axis lengths, which had no relation to the zero resistance temperatures, were substantially constant in a range of 0.385 to 0.386 nm Thus, it is understood that a zero resistance temperature of at least 125 K can be obtained when the a-axis length is 0.385 to 0.386 nm and the c-axis length is at least 3.575 nm. Particularly the sample No. 12 having the lattice constants of a=0.3855 nm and c=3.577 nm exhibited the highest zero resistance temperature of 127 K.

Figure 3:
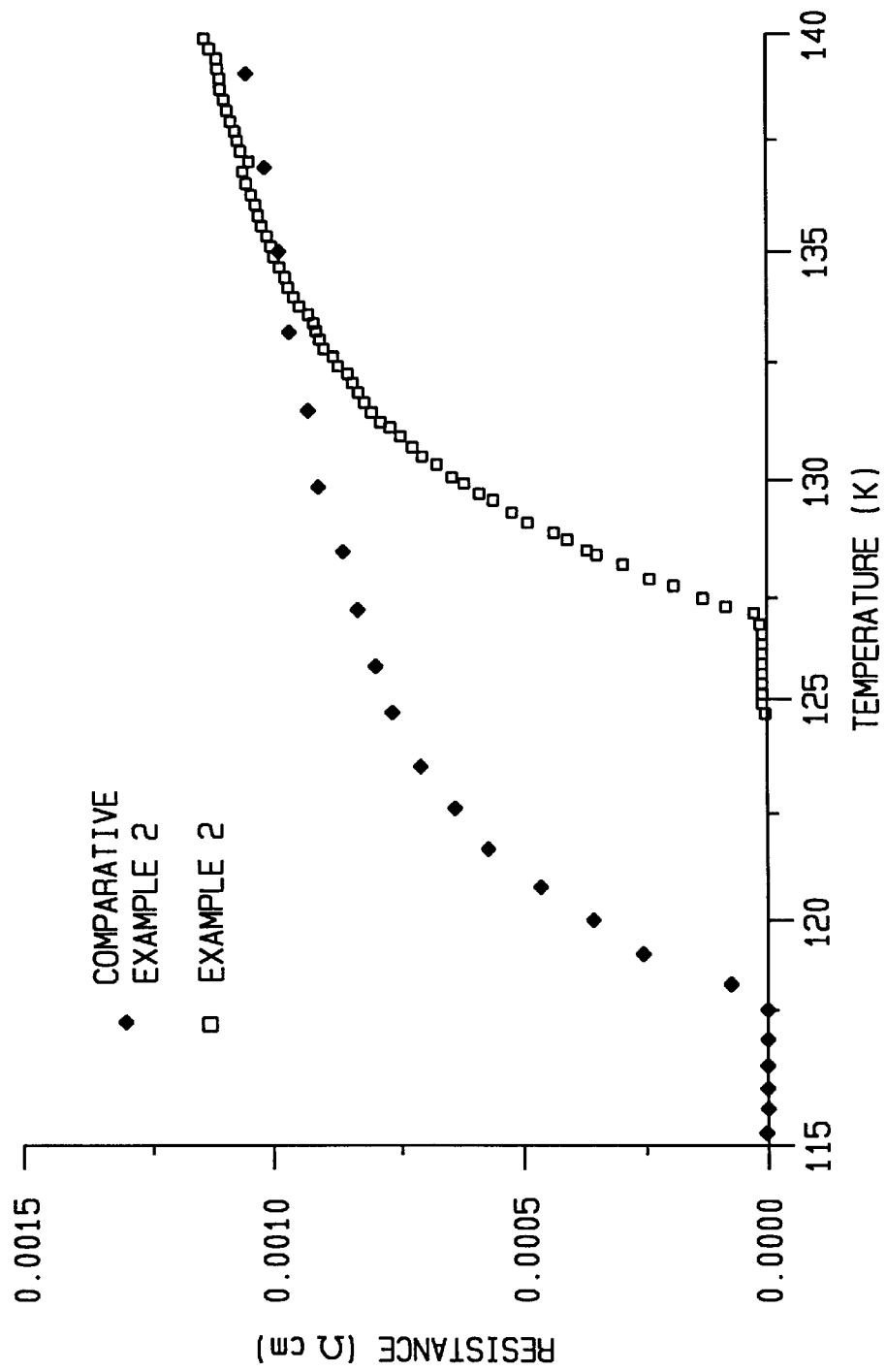
FIG. 3 illustrates resistance/temperature characteristics in relation to Example 2 according to the present invention.

FIG. 3 shows resistance/temperature characteristics of the sample No. 12 according to Example 2 and those of the comparative example 2, which was not annealed.

Figure 4:
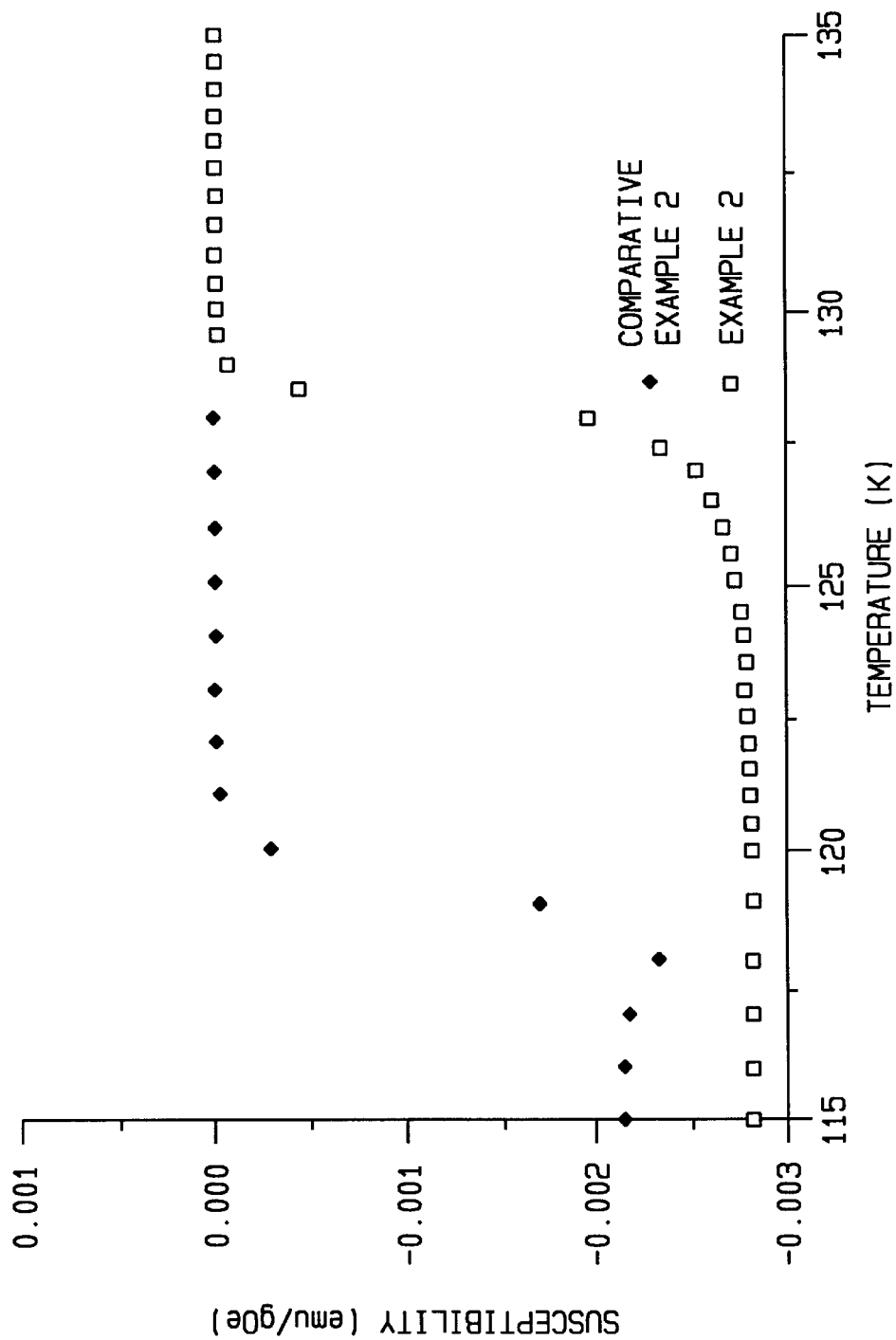
FIG. 4 illustrates susceptibility /temperature characteristics in relation to Example 2 according to the present invention.

FIG. 4 illustrates susceptibility/temperature characteristics of Example 2 (sample No. 12) and the comparative example 2.

As clearly understood from FIGS. 3 and 4, the sample No. 12 according to Example 2 exhibited the zero resistance temperature and the diamagnetic signal starting temperature at 127 K.

Figure 5:
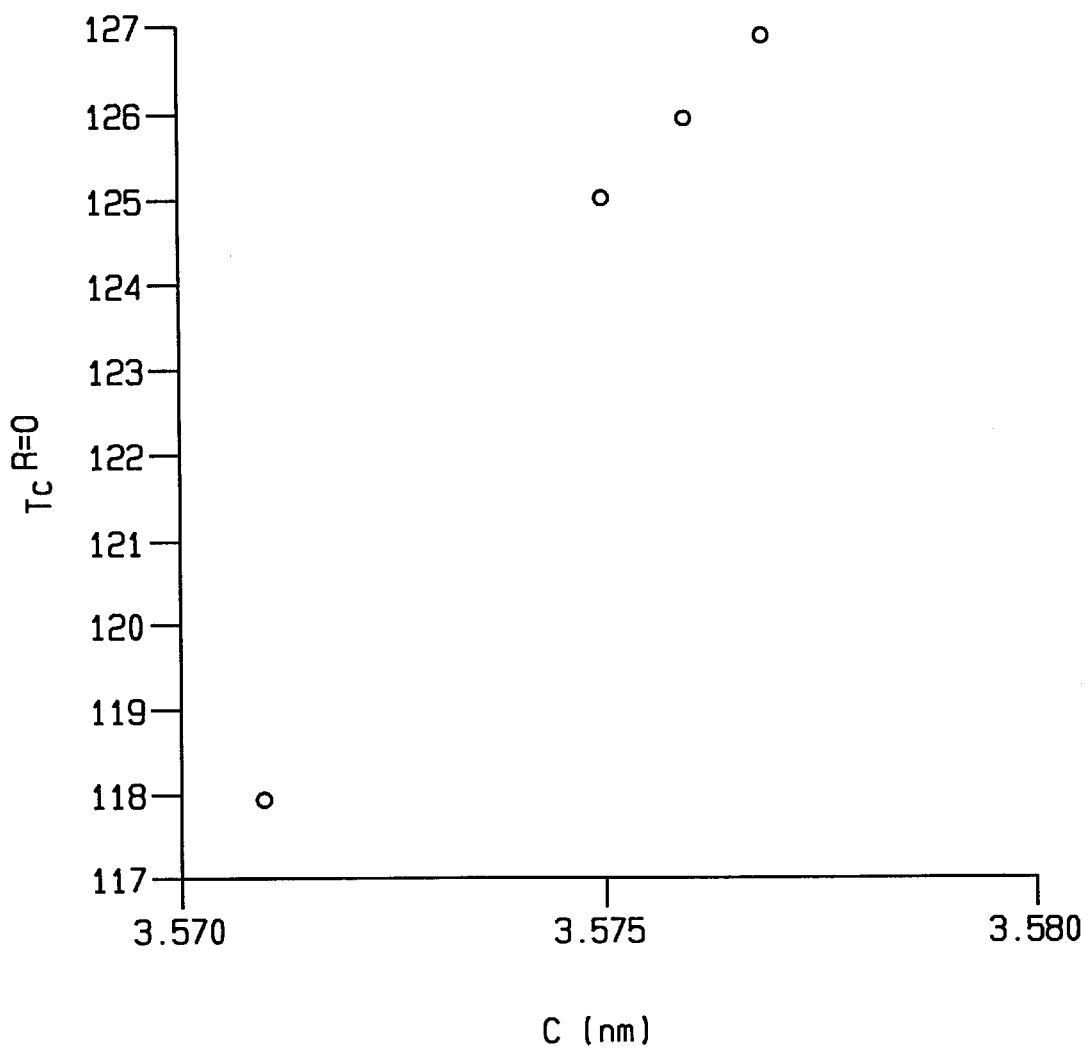
FIG. 5 illustrates a lattice constant c of Example 2 according to the present invention.
Figure 6:
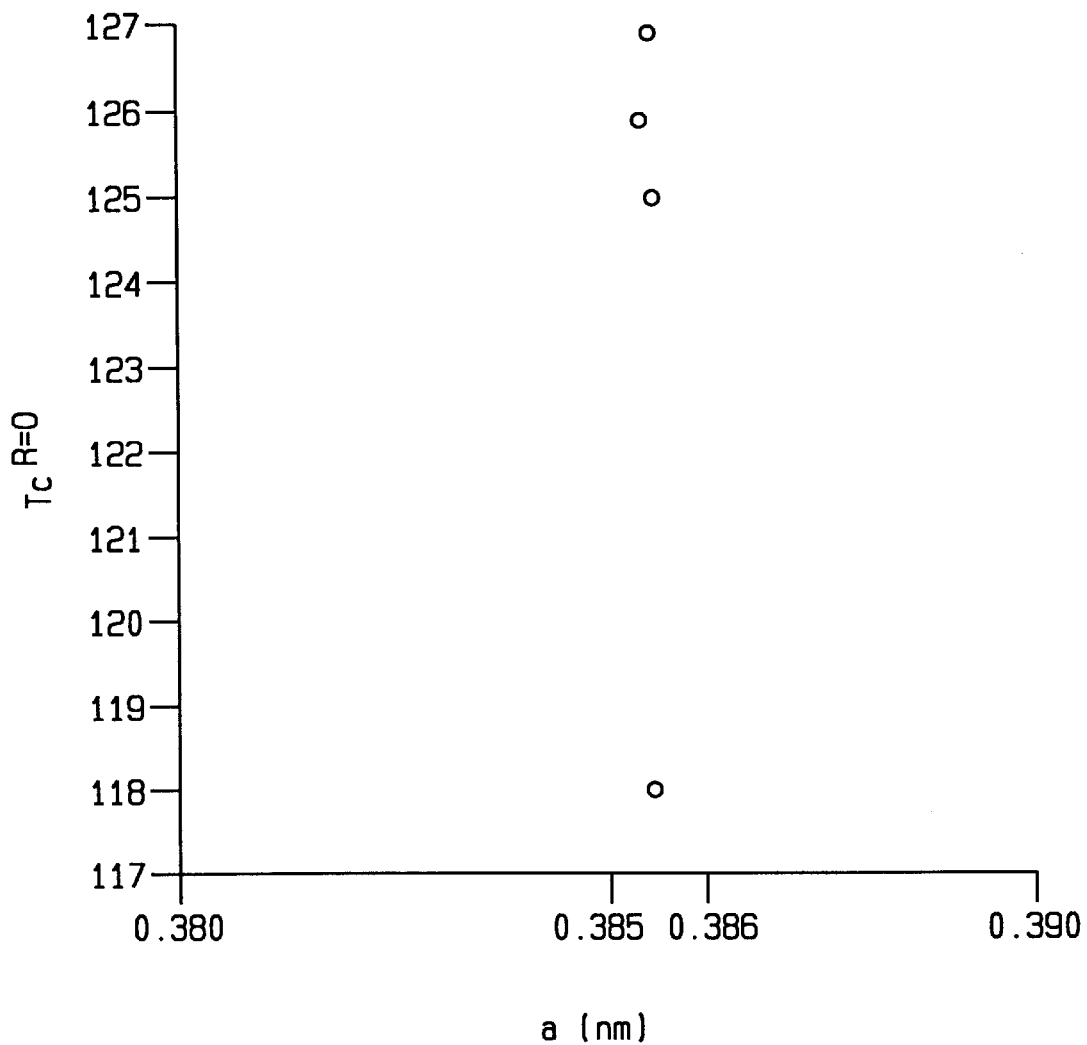
FIG. 6 illustrates a lattice constant a of Example 2 according to the present invention.

FIGS. 5 and 6 illustrate lattice constants of the inventive samples Nos. 5, 11 and 12 according to Example 2 of the present invention and the sample No. 1, which was out of the annealing conditions for the inventive method, respectively.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of preparing an oxide superconductive material being expressed in the following formula:

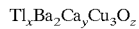

where x, y and z are in relations satisfying $1.5 \leq x \leq 2.0$, $2.0 \leq y \leq 2.5$, $x+y=4.0$ and $9.0 \leq z \leq 11.0$, said method comprising the steps of:

mixing powder raw materials of Tl, Ba, Ca and Cu compounds in blending ratios to form a mixed powder satisfying said composition formula;

sintering the as-formed mixed powder in flowing oxygen gas in the atmosphere to obtain a sintered body; and annealing said sintered body in a closed atmosphere at 700° to 800° C. for at least 10 hours.

2. A method of preparing an oxide superconductive material having the following composition formula:

$$Tl_xBa_2Ca_yCu_3O_z$$

in which $1.5 \leq x \leq 2.0$, $2.0 \leq y \leq 2.5$, $x+y=4.0$ and $9.0 \leq z \leq 11.0$, said method comprising the steps of:

mixing powdered raw materials of Tl, Ba, Ca and Cu compounds in blending ratios to form a mixed powder satisfying said composition formula;

sintering the as-formed mixed powder in flowing oxygen gas in a system open to the atmosphere to obtain a sintered body; and annealing said sintered body in a closed atmosphere at 750° C. for 250 hours to prepare said oxide superconductive material.

3. A method of preparing an oxide superconductive material having the following composition formula:

$$Tl_{1.7}Ba_2Ca_{2.3}CU_3O_z$$

in which $9.0 \leq z \leq 11.0$, said material comprising tetragonal system superconducting phases having lattice constants of a=0.385 to 0.386 nanometers and c longer than 3.575 nanometers, said method comprising the steps of:

mixing powdered raw materials of Tl, Ba, Ca and Cu compounds in blending ratios to form a mixed powder satisfying said composition formula;

sintering the as-formed mixed powder in flowing oxygen gas in a system open to the atmosphere to obtain a sintered body; and annealing said sintered body in a closed atmosphere at 700° to 800° C. for more than 10 hours up to 500 hours to prepare said oxide superconductive material.

4. The method of preparing an oxide superconductive material as in one of claims 1–3, wherein said closed atmosphere is in a decompressed state.

* * * * *